United States Patent
Funakubo

(10) Patent No.: US 9,920,910 B2
(45) Date of Patent: Mar. 20, 2018

(54) METHOD FOR MOUNTING LIGHT-EMITTING ELEMENTS

(71) Applicants: CITIZEN ELECTRONICS CO., LTD., Yamanashi (JP); CITIZEN HOLDINGS CO., LTD., Tokyo (JP)

(72) Inventor: Takuya Funakubo, Yamanashi (JP)

(73) Assignees: CITIZEN ELECTRONICS CO., LTD., Yamanashi (JP); CITIZEN WATCH CO., LTD., Tokyo (JP)

(*) Notice: Subject to any disclaimer, the term of this patent is extended or adjusted under 35 U.S.C. 154(b) by 92 days.

(21) Appl. No.: 13/684,308

(22) Filed: Nov. 23, 2012

(65) Prior Publication Data
US 2013/0163241 A1    Jun. 27, 2013

(30) Foreign Application Priority Data

Nov. 25, 2011 (JP) ................. 2011-257049

(51) Int. Cl.
| | |
|---|---|
| *H01L 21/00* | (2006.01) |
| *F21V 21/00* | (2006.01) |
| *F21V 7/00* | (2006.01) |
| *H05K 13/00* | (2006.01) |
| *H01L 25/075* | (2006.01) |

(52) U.S. Cl.
CPC ............ *F21V 21/00* (2013.01); *F21V 7/0066* (2013.01); *H01L 25/0753* (2013.01);
(Continued)

(58) Field of Classification Search
CPC ............ F21Y 2101/02; F21Y 2111/007; F21Y 2105/001; F21Y 2103/022;
(Continued)

(56) References Cited

U.S. PATENT DOCUMENTS

| | | | | |
|---|---|---|---|---|
| 2003/0137838 A1* | 7/2003 | Rizkin | ................... | E01F 9/065 362/240 |
| 2005/0265024 A1* | 12/2005 | Luk | ......................... | F21S 10/02 362/231 |

(Continued)

FOREIGN PATENT DOCUMENTS

| | | |
|---|---|---|
| JP | 05-102525 | 4/1993 |
| JP | 2006310319 | 11/2006 |

(Continued)

OTHER PUBLICATIONS

Japanese Office Action for Japanese Application No. 2012256783, dated Jul. 1, 2016, 8 pages.
(Continued)

*Primary Examiner* — Duy T Nguyen
(74) *Attorney, Agent, or Firm* — RatnerPrestia

(57) ABSTRACT

In a first aspect of the present invention, it is suggested that a mounting method for mounting light-emitting elements as evenly as possible in a mounting area of a lighting device may permit increased number of light-emitting elements. In a second aspect of the present invention, a lighting device including a substrate with a circular mounting area, a plurality of light-emitting elements configured to be positioned at centers of equal smaller circular areas that are calculated to be equal in size in the circular mounting area, the equal smaller circular areas being equal in size to each other and set as large as possible without an overlapping portion in the circular mounting area, a total area of the equal smaller circular areas being smaller than the circular mounting area, and the light-emitting elements and the equal smaller circular areas being the same in number is suggested.

5 Claims, 13 Drawing Sheets

(52) U.S. Cl.
CPC ............... H05K 13/0015 (2013.01); *H01L 2224/48137* (2013.01); *H01L 2224/48464* (2013.01); *H01L 2924/181* (2013.01); *H01L 2933/0033* (2013.01); *H01L 2933/0066* (2013.01); *Y10T 29/49002* (2015.01)

(58) Field of Classification Search
CPC ............... F21Y 2111/008; H01L 21/66; H01L 2924/181; H01L 2924/00012; H01L 2224/48137; H01L 2224/48464; H01L 25/0753; H01L 2933/0033; H01L 2933/0066
USPC ........................................ 438/28, 22; 257/79
See application file for complete search history.

(56) References Cited

U.S. PATENT DOCUMENTS

| | | | |
|---|---|---|---|
| 2007/0181901 A1* | 8/2007 | Loh | 257/99 |
| 2007/0247855 A1* | 10/2007 | Yano | H01L 33/641 362/294 |
| 2008/0013311 A1* | 1/2008 | Rubtsov | F41H 13/0087 362/231 |
| 2009/0296414 A1* | 12/2009 | Moriyama et al. | 362/373 |
| 2010/0320483 A1* | 12/2010 | Kadotani | F21K 9/00 257/88 |
| 2011/0116252 A1* | 5/2011 | Agatani et al. | 362/84 |
| 2012/0127710 A1* | 5/2012 | Jurik | F21V 5/008 362/235 |

FOREIGN PATENT DOCUMENTS

| | | |
|---|---|---|
| JP | 3169983 | 8/2011 |
| JP | 2012-028864 | 2/2012 |

OTHER PUBLICATIONS

Notification of Reasons for Refusal for Japanese Application No. 2016-253153, dated Nov. 7, 2017, including English translation, 5 pages.

* cited by examiner

| N | r | d |
|---|---|---|
| 4 | 0.414 | 0.686 |
| 6 | 0.333 | 0.667 |
| 8 | 0.303 | 0.733 |
| 10 | 0.262 | 0.688 |
| 12 | 0.248 | 0.739 |
| 14 | 0.231 | 0.747 |
| 16 | 0.217 | 0.751 |
| 18 | 0.206 | 0.761 |
| 20 | 0.195 | 0.762 |
| 22 | 0.184 | 0.743 |
| 24 | 0.177 | 0.751 |
| 26 | 0.172 | 0.765 |
| 28 | 0.166 | 0.774 |
| 30 | 0.161 | 0.781 |
| 32 | 0.156 | 0.774 |
| 34 | 0.151 | 0.778 |
| 36 | 0.148 | 0.791 |
| 38 | 0.144 | 0.784 |
| 40 | 0.140 | 0.788 |
| 42 | 0.136 | 0.778 |
| 112 | 0.085 | 0.817 |
| 272 | 0.056 | 0.843 |

METHOD FOR MOUNTING LIGHT-EMITTING ELEMENTS

RELATED APPLICATION

This application is a new US patent application that claims benefit of JP 2011-257049 filed on Nov. 25, 2011, the entire content of JP 2011-257049 is hereby incorporated by reference.

TECHNICAL FIELD

The present invention relates to a method for mounting light emitting elements and a lighting device including light emitting elements, and more specifically, to a method of mounting light emitting elements for mounting N light emitting elements as evenly as possible in a mounting area of a lighting device and to a lighting device including N light-emitting elements that are mounted as evenly as possible in a mounting area of the lighting device.

BACKGROUND

In recent years, light-emitting elements as semiconductor elements have been widely utilized as light-emitting elements in a backlight system of a color display device or in a lighting device since those light emitting elements can have long usable lifetime and excellent drive characteristics in addition to the small size and high light emission efficiency as well as the brilliant color of emitted light.

In particular, in order to mount a plurality of light-emitting elements to achieve high brightness in a mounting area of a shape, various lighting devices have been proposed (for example, Patent Document 1, Patent Document 2, and Patent Document 3).

A conventional lighting device including a plurality of light-emitting elements mounted in a mounting area of a shape will be described below. In the lighting device described in Patent Document 1 or in Patent Document 2, a plurality of light-emitting elements are disposed in a circular mounting area in linear arrangement with a separation between each pair of adjacent light-emitting elements, and the light-emitting elements are electrically connected to form a lighting device with multiple elements for light emission.

In the lighting devices described in Patent Document 1 and Patent Document 2, a plurality of light-emitting elements are disposed in the mounting area in linear arrangement with a separation between each pair of adjacent light-emitting elements. Thus, in the lighting devices described in Patent Document 1 and Patent Document 2, there may be another arrangement of the light-emitting elements in the mounting area to be desirable.

The lighting device described in Patent Document 3 is a dichromatic light emission lighting device in which two light-emitting elements (red light-emitting elements and green light-emitting elements) with different color of emission are arranged in close contact with each other in a circular mounting area appear to be a generally circular light emission when the light-emitting element of each color is lighted.

In the lighting device described in Patent Document 3, the light-emitting elements are arranged partially in close contact with each other. However, the main purpose of the arrangement is to realize a same circular form when the light-emitting elements of each color of the dichromatic lighting device are lighted. Therefore, in the lighting device described in Patent Document 3, there may be another arrangement of the light-emitting elements to be desirable in the mounting area.

Patent Document 1: JP 2011-28864-A
Patent Document 2: JP U 3169983-B
Patent Document 3: JP H05-102525-A

SUMMARY

The present invention is proposed in view of above-described conventional lighting devices. A mounting method for mounting a plurality of light-emitting elements as evenly as possible in a circular mounting area and a lighting device including a plurality of light-emitting elements that are mounted as evenly as possible in a mounting area of the lighting device are proposed in various embodiments of the present invention.

In accordance with a first aspect of the present invention, there is provided a mounting method for mounting light-emitting elements desirably in a mounting area of a lighting device that may permit increased number of light-emitting elements to be contained in the mounting area.

In accordance with a second aspect of the present invention, a lighting device including a substrate with a circular mounting area, a plurality of light-emitting elements configured to be positioned at centers of equal smaller circular areas that are calculated to be equal in size in the circular mounting area, the equal smaller circular areas being equal in size to each other and set as large as possible without an overlapping portion in the circular mounting area, a total area of the equal smaller circular areas being smaller than the circular mounting area, and the light-emitting elements and the equal smaller circular areas being the same in number is suggested.

BRIEF DESCRIPTION OF THE DRAWINGS

These and other features and advantages of the present invention will be better understood by reading the following description of embodiments taken together with the drawings wherein:

FIG. 17 is a chart showing the proportion (packing ratio) d of the area occupied by the smaller circular areas in the mounting area, wherein radius of the mounting area (large circle) is R, the number of smaller circular areas disposed in the circular mounting area is N, and the largest possible radius of the smaller circular area is r;

DESCRIPTION OF EMBODIMENTS

A mounting method for mounting light-emitting elements according to the present invention will be described below with reference to drawings. However, it should be noted that the technical scope of the present invention is not limited to those embodiments, but includes inventions as described in appended claims and their equivalents.

Figure 1:
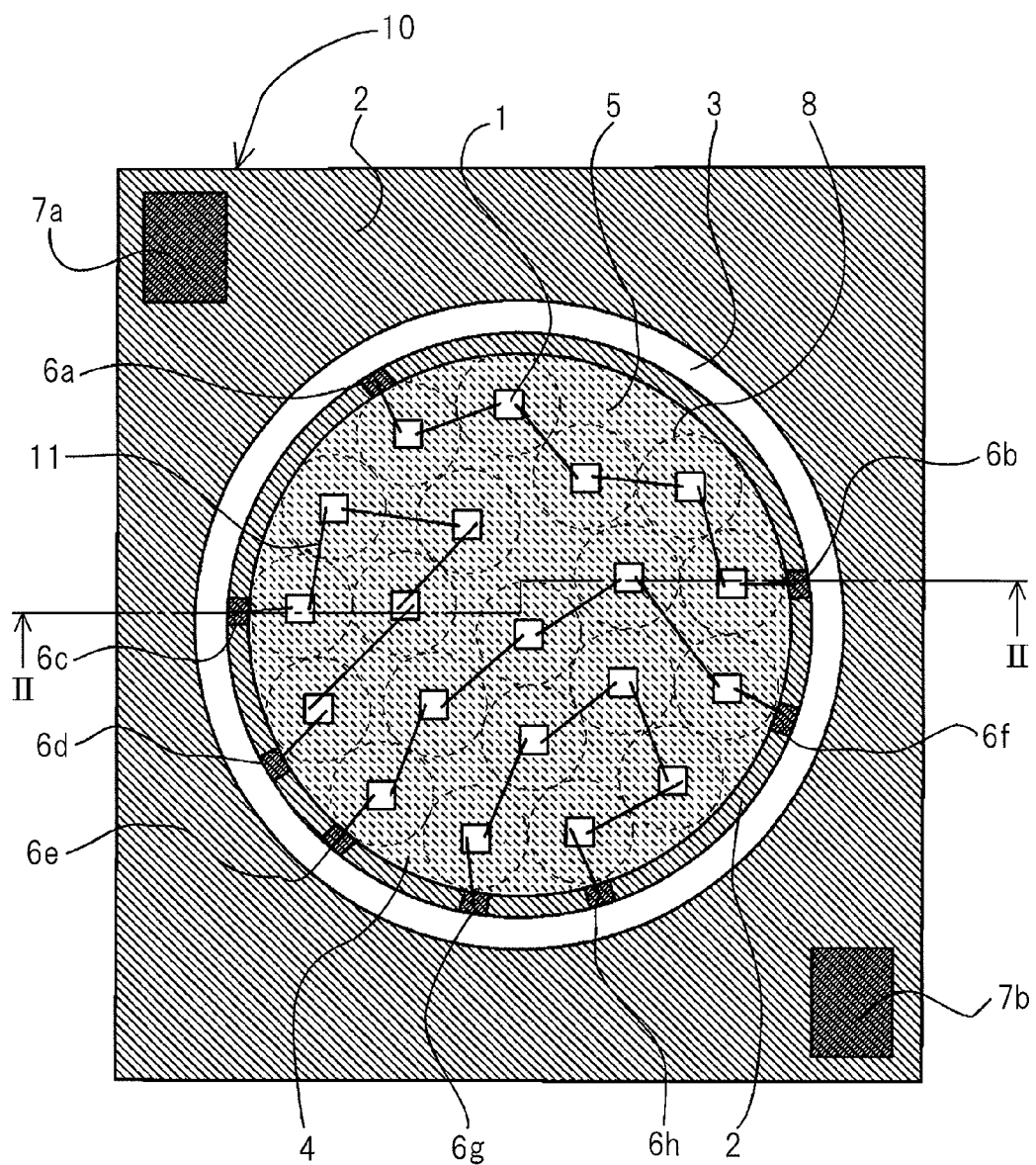
FIG. 1 is a top plan view showing a lighting device 10 according to a first embodiment.
Figure 2:
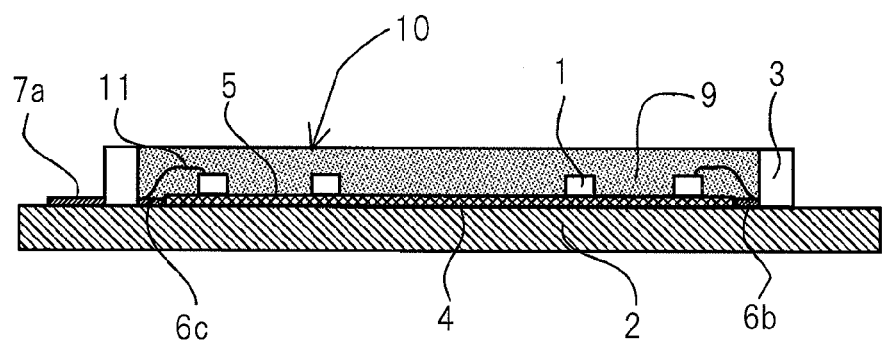
FIG. 2 is a sectional view taken along the line II-II of the lighting device 10 shown in FIG. 1.

FIG. 1 is a top plan view showing a lighting device 10 according to a first embodiment, and FIG. 2 is a sectional view taken along the line A-A of FIG. 1.

The lighting device 10 of the present embodiment includes a substrate 2 that includes a circular mounting area 5, and a plurality of light-emitting elements 1 disposed in the circular mounting area and configured to be positioned at centers of equal smaller circular areas 8 calculated to be equal in size.

A circular enclosure frame 3 is adhered to a surrounding portion of the circular mounting area 5, on the upper surface of the substrate 2 that is included in the lighting device 10. In the present embodiment, a reflection layer 4 that is an insulating white-colored reflection treatment given to an aluminum base is arranged at the mounting area 5, which is surrounded by the enclosure frame 3, and on which light-emitting elements 1 are disposed. The insulating reflection layer 4 has a circular plate shape of radius R, and constitutes the circular mounting area 5 of radius R.

On the upper surface of the substrate 2, connecting electrodes 6a-6h electrically connecting to the light-emitting elements 1 is provided adjacent to the mounting area, and power supply electrodes 7a, 7b configured to supply electric power from outside are provided. The connecting electrodes 6a-6h may be partially exposed between the inner periphery of the enclosure frame 3 and the mounting area 5. The power supply electrodes 7a, 7b are provided at diagonal positions on the substrate 2, and are connected (not shown) to the connecting electrodes 6a-6h, as mentioned below. Note that the number and arrangement of connecting electrodes and the power supply electrodes are not limited to those described in the present embodiment.

As disclosed in some embodiments of the present invention, N smaller circular areas each with radius of r set as large as possible are all arranged without an overlapping portion inside the circular mounting area 5 of radius R. A total area of the N smaller circular areas 8 is smaller than the circular mounting area. In the present embodiment, as will be described later, 20 smaller circular areas 8 each with radius of r as indicated by dotted line are provided in the mounting area 5 of the substrate 2.

A light-emitting element 1 has an upper surface with a pair of electrodes and has a lower surface that is mounted on and adhered to the center position of each smaller circular area 8. Light emitting elements 1 are electrically connected by metal wires 11 and also electrically connected to a pair of connecting electrodes 6 by metal wires 11. Specifically, five light-emitting elements 1 are connected in series by the wires 11 between the connecting electrodes 6a, 6b, five light-emitting elements 1 are connected in series by the wires 11 between the connecting electrode 6c and the connecting electrode 6d, five light-emitting elements 1 are connected in series by the wires 11 between the connecting electrode 6e and the connecting electrode 6f, and five light-emitting elements 1 are connected in series by the wires 11 between the connecting electrode 6g and the connecting electrode 6h.

The connecting electrodes 6a, 6c, 6e, 6g are electrically connected through a wiring pattern (not shown) on the substrate 2 to the power supply electrode 7a, and the connecting electrodes 6b, 6d, 6f, 6h are electrically connected through a wiring pattern (not shown) on the substrate 2 to the power supply electrode 7b. Thus, with five light-emitting elements 1 connected in series as one group, 4 groups connected in parallel constitute a combination of series-parallel connection. By filling sealing resin 9 that may be a transparent resin or a resin including a phosphor into a space demarcated by the enclosure frame 3 and the mounting area 5 on that 20 light-emitting elements 1 are mounted, a lighting device 10 may be made. The lighting device 10 can be driven to emit light by the driving electric voltage supplied to the power supply electrodes 7a, 7b.

Figure 3:
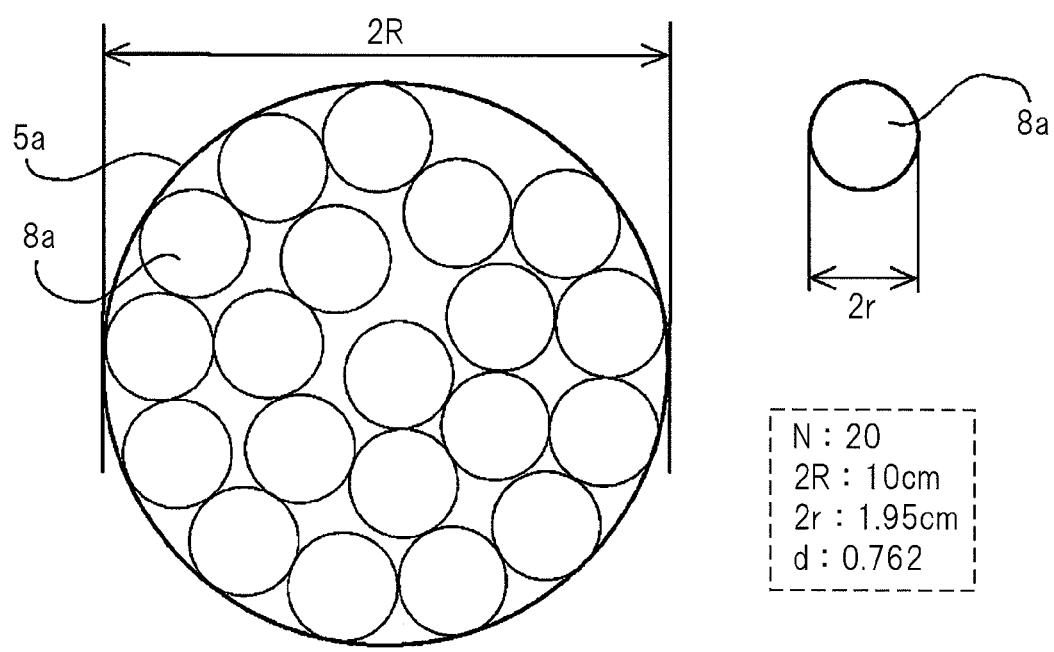
FIG. 3 is a view showing an arrangement of 20 smaller circular areas arranged in a circular mounting area of the lighting device 10 shown in FIG. 1.
Figure 4:
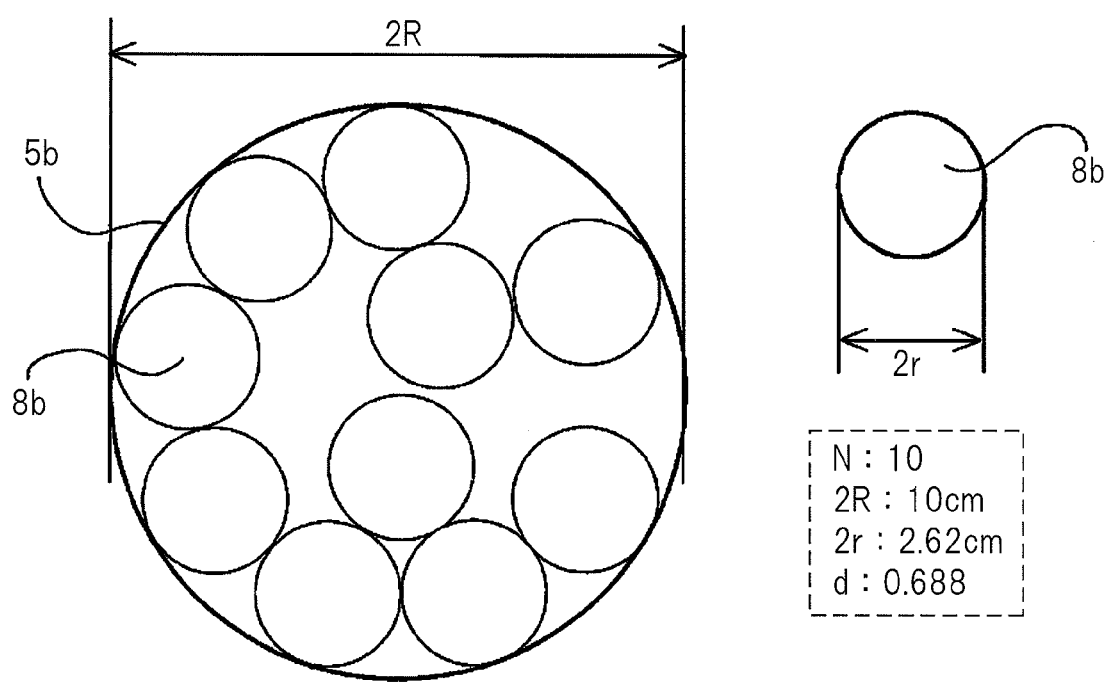
FIG. 4 is a view showing an arrangement of 10 smaller circular areas arranged in a circular mounting area of the lighting device 10 shown in FIG. 1.

FIG. 3 is a view showing an arrangement of the mounting area 5a in that 20 same smaller circular areas 8a as those shown in the lighting device 10 of FIG. 1 are arranged as the smaller circular areas 8. FIG. 4 is a view for comparison showing an arrangement of the mounting area 5b in that 10 smaller circular areas 8b are arranged as the smaller circular areas 8. Arrangement of smaller circular areas 8 in the mounting area 5 shown in FIG. 1 will be described below with reference to FIG. 3 and FIG. 4.

It is known that, when the radius R of a circular mounting area and the number N of smaller circular areas to be disposed in the circular mounting area are determined, an arrangement of the smaller circular areas is uniquely determined under a certain arrangement condition. A certain arrangement condition here is that "N smaller circular areas each with radius of r set as large as possible are all arranged without an overlapping portion inside the circular mounting area of radius R." This arrangement condition is derived from the theory of packing equal smaller circles in two dimensions.

Figure 9:
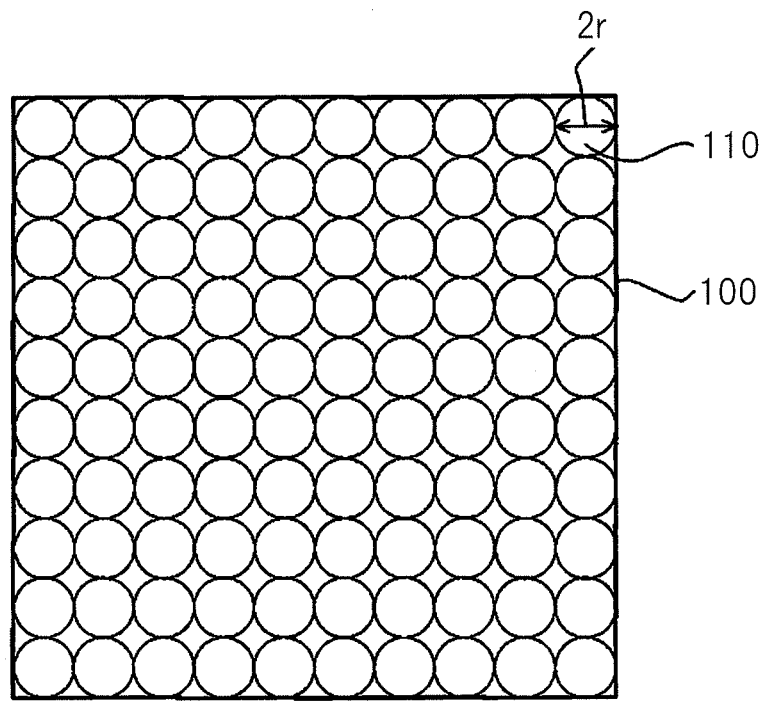
FIG. 9 is a view showing arrangement of circles of 2r in diameter arranged in straight lines in an area of square shape.
Figure 10:
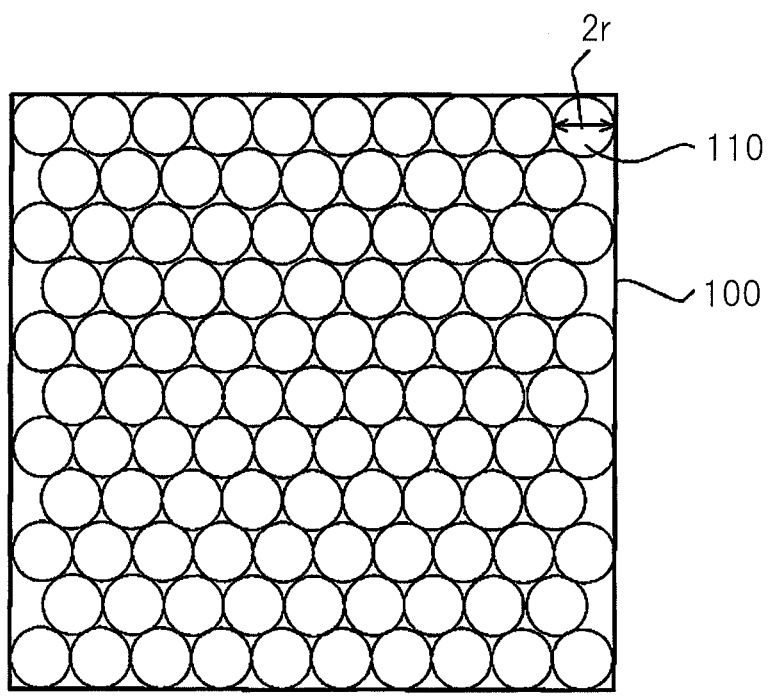
FIG. 10 is a view showing an arrangement of circles of 2r in diameter arranged in close packing in the area of square shape.

With reference to FIG. 9 and FIG. 10, arrangement of a plurality of circles of equal size (corresponding to the smaller circular areas) will be described below, focusing on arrangements of the equal circles to be as many circles as possible without an overlapping portion in an area.

In FIG. 9 and FIG. 10, in order to clarify the explanation, a square-shaped area 100 in that circles 110 of diameter 2r (radius r) are arranged is shown. As an example, FIG. 9 shows an area 100 in that a plurality of circles 110 are disposed in linear arrangement in horizontal and vertical directions. As shown, ten circles 110 are arranged in each row and each column, and thus, the total number of circles 110 is 100. FIG. 10, on the other hand, as an example, shows an area 100 in that circles 110 are arranged in close packing by shifting positions of the circles in rows. In FIG. 10, rows of circles alternately include 10 circles and then 9 circles, and there are 11 columns of circles, and thus, total number of circles 110 can be 105. In the example of FIG. 10, although gaps are partially large, efficiency of containment of circles is higher. From this example, it can be seen that, for arranging circles 110 in an area 100, the total number of circles contained can be larger when circles are arranged in close packing by shifting positions of adjacent circles of rows than when circles 110 are disposed in linear arrangement in horizontal and vertical directions.

Figure 18:
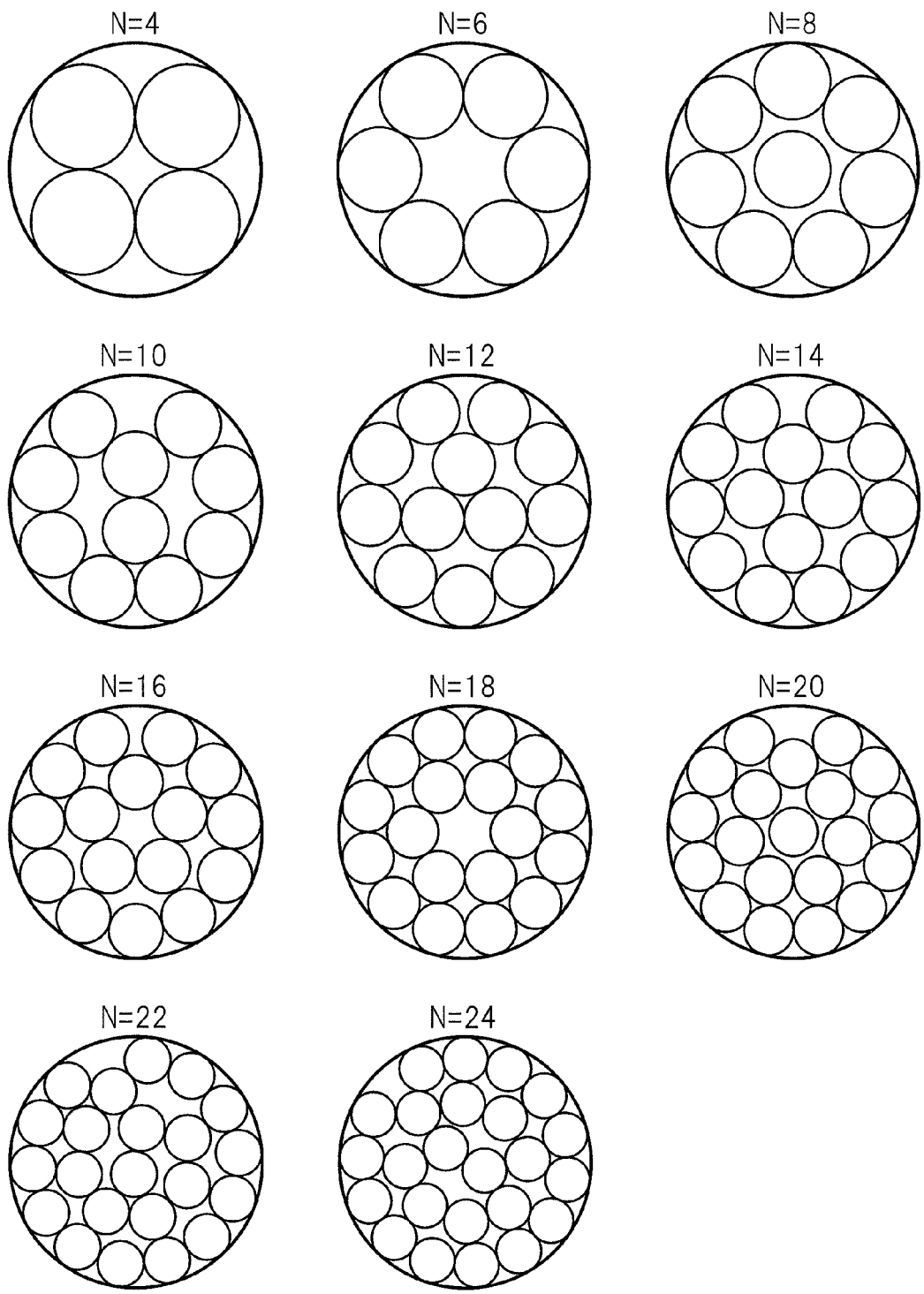
FIG. 18 is a view showing a specific arranging method (1) in a circular mounting area.
Figure 19:
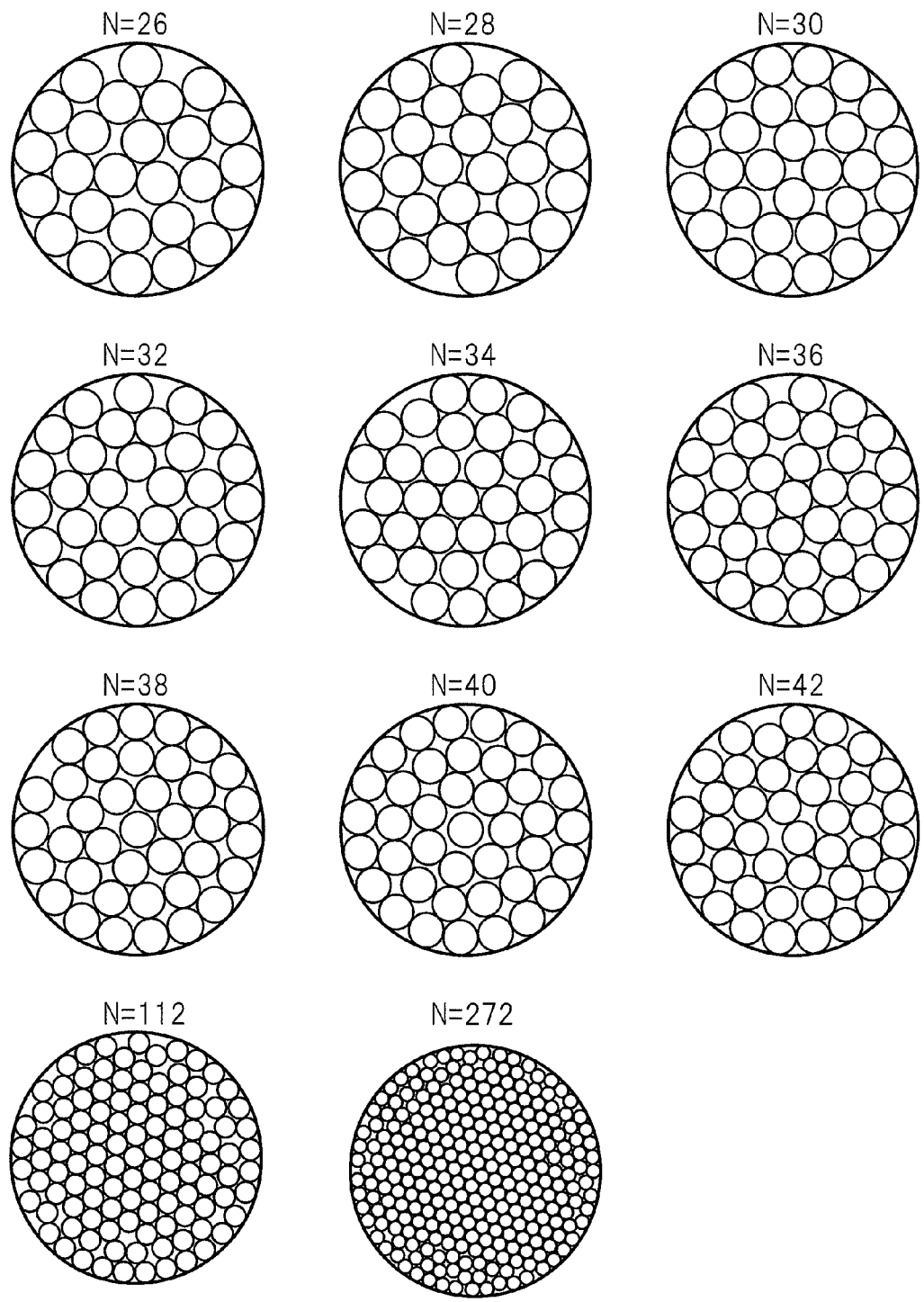
FIG. 19 is a view showing further specific arranging method (2) in a circular mounting area.

FIG. 17 is a chart showing the proportion (packing ratio) d of total area of smaller circular areas in the mounting area based on the theory of close packing of circles, for the radius R of the mounting area (large circle) of R=1, the number of smaller circular areas (smaller circles) is N, and for the maximum radius of each equal smaller circular area is r. FIG. 18 and FIG. 19 are views specifically showing arrangements of N smaller circular areas listed in the chart in FIG. 17.

FIG. 3 corresponds to an arrangement of the number N=20 that is shown in FIG. 17. If the radius R of the mounting area 5a is taken as R=5 cm, the diameter 2R of the mounting area is 10 cm. As shown in FIG. 17, radius r of the smaller circular area is r=0.195, and thus, the diameter 2r of the smaller circular area shown in FIG. 17 is 0.195×2× 5=1.95 cm. In the example of FIG. 3, the above described arrangement condition that "N smaller circular areas each with radius of r set as large as possible are all arranged without an overlapping portion inside the circular mounting area of radius R" is satisfied. In the arrangement of FIG. 3, the packing ratio of the smaller circular areas 8a is 0.762.

FIG. 4 is shown for comparison, and corresponds to the case of arrangement in that N is 10 smaller circular areas listed in the chart of FIG. 17. If the radius of the mounting area 5a is 5 cm, the diameter 2R of the mounting area is 10 cm. As shown in FIG. 17, radius r of the smaller circular area 8b is 0.262, and the diameter 2r of the smaller circular area 8a shown in FIG. 17 is 0.262×2×5=2.62 cm. In the example of FIG. 4, the above-described arrangement condition that "N smaller circular areas each with radius of r set as large as possible are all arranged without an overlapping portion inside the circular mounting area of radius R" is satisfied. Packing ratio d of the smaller circular areas 8a in the arrangement of FIG. 4 is 0.688.

It can be seen from FIG. 17 that, under a condition of a same area of the mounting area, when the number N of the smaller circular areas is increased, the value of the packing ratio d becomes higher, and intensity of light emission as a lighting device can be enhanced. Thus, in order to achieve required intensity of light emission as a lighting device, it is desired that the packing ratio d of the smaller circular areas is not less than a certain value. Experimentally, it is desired that the packing ratio d is not less than 0.75, and therefore, the number N of the light-emitting elements is desirably 16 or more. In this sense, the arrangement of FIG. 4 (N=10) is not satisfactory, since the packing ratio d is 0.688 and is less than 0.75, and thus, sufficient intensity of light emission is difficult to be obtained. On the other hand, the arrangement of FIG. 3 (N=20) is satisfactory since the packing ratio d is 0.762 and is not less than 0.75, and thus, sufficient intensity of light emission can be expected to be obtained.

Figure 5:
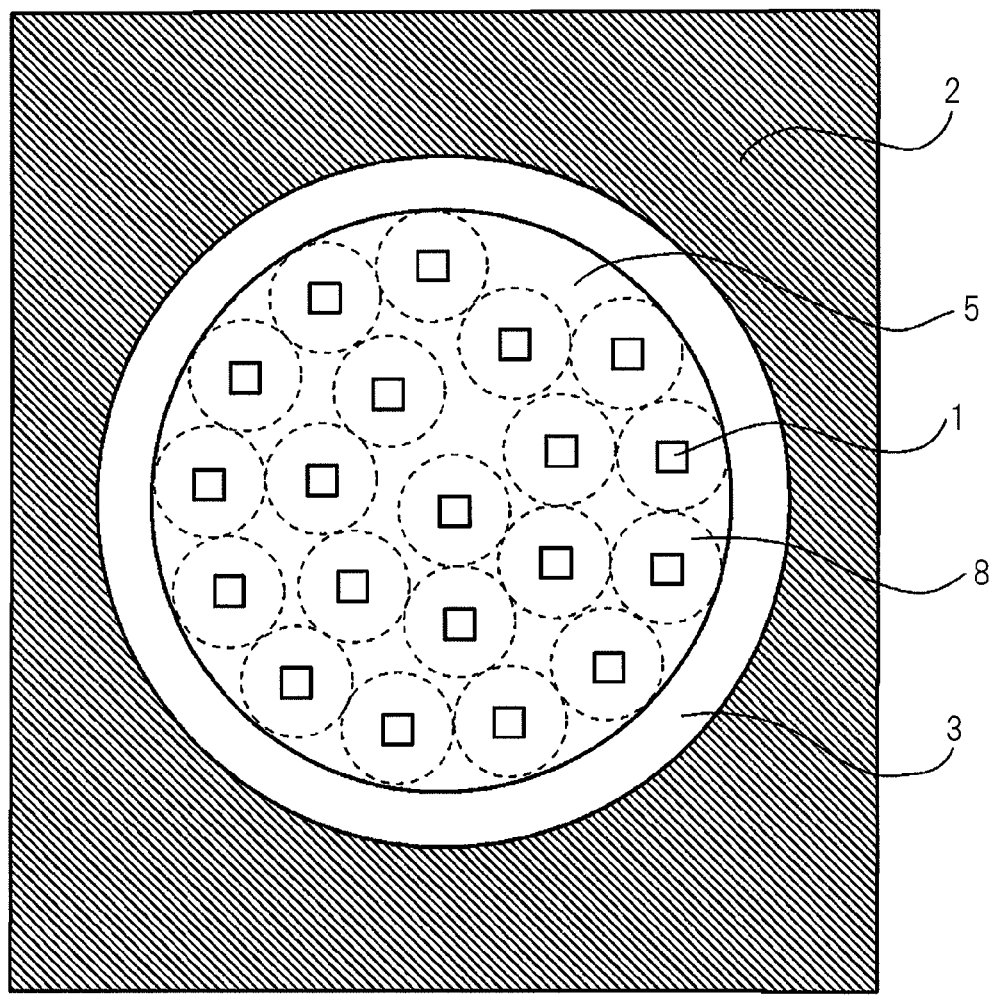
FIG. 5 is a schematic top plan view showing the substrate of the lighting device 10 shown in FIG. 1.

FIG. 5 is a schematic top plan view showing the substrate 2 shown in FIG. 1.

Referring to FIG. 5, the configuration of arrangement in that smaller circular areas 8 are arranged inside the circular mounting area 5 (large circle) of the substrate 2, and mounting light-emitting elements 1 in the arranged smaller circular areas 8 will be described below. In FIG. 5, 20 smaller circular areas 8 are arranged in the mounting area 5 that is situated inside the enclosure frame 3. Thus, by tracing the smaller circular areas 8 of the arrangement shown in FIG. 3, the smaller circular areas 8 are positioned in the mounting area 5 as shown by dotted lines. In this state, a light-emitting element 1 is mounted and adhered to at the center position of each smaller circular area 8. Then, the light-emitting elements 1 in a group are electrically connected with wires in series as shown in FIG. 1, and are also electrically connected to a pair of connecting electrodes 6 with wires 11 as a lighting device 10.

Figure 6:
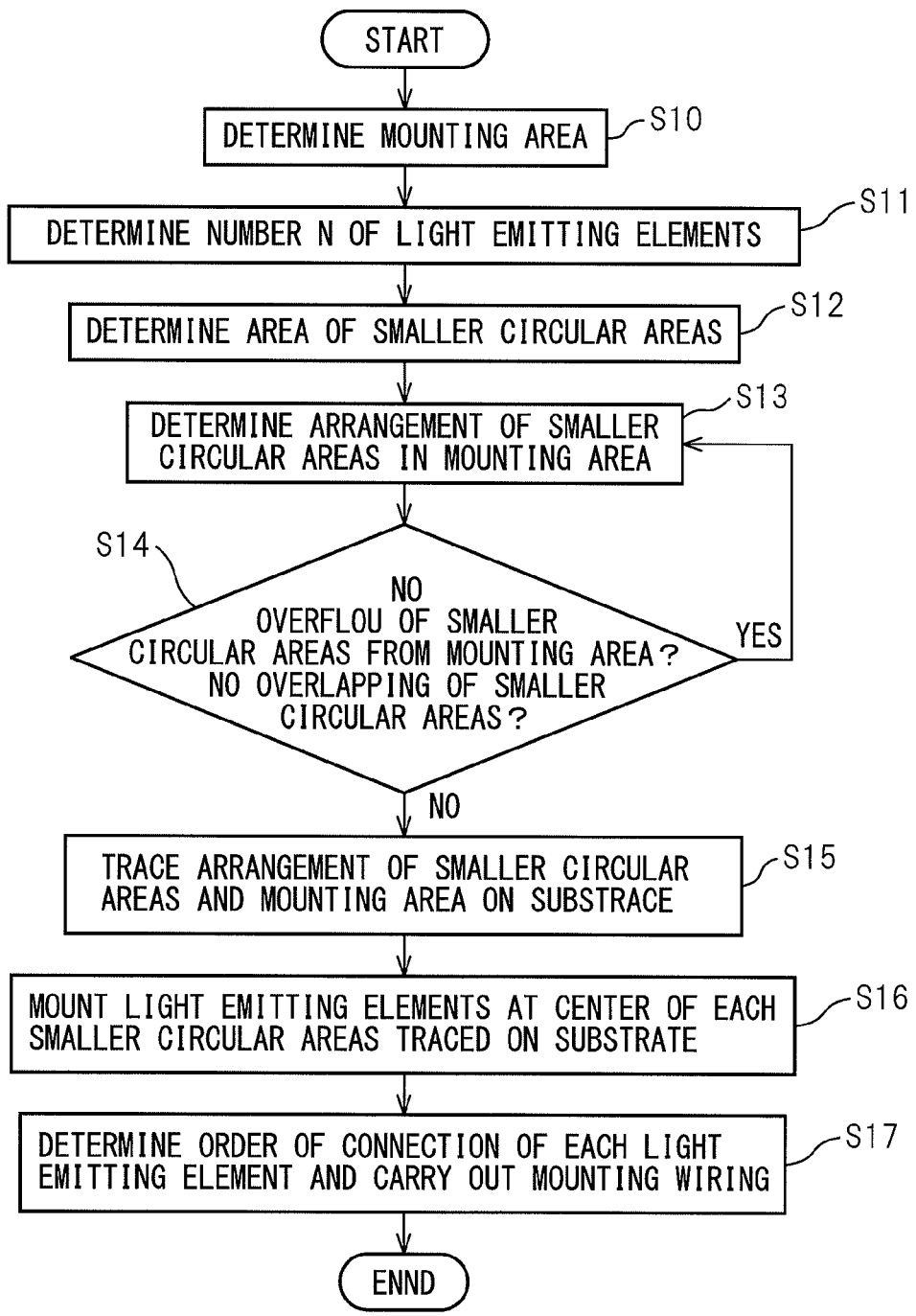
FIG. 6 is a flow chart showing manufacturing process of the lighting device shown in FIG. 1.

FIG. 6 is a flow chart showing the manufacturing process for manufacturing the lighting device 10.

First, the mounting area in that the light-emitting elements 1 are to be mounted is determined (S10), and the number N of light-emitting elements 1 is determined (S11). Thus, it is determined how many light-emitting elements are to be mounted in how large mounting area in accordance with the size of the lighting device to be manufactured. Order of the step S10 and the step S11 may be reversed.

Next, area of the smaller circular area 8 at a center of that a light-emitting element 1 is arranged is determined (S12). Radius r of the smaller circular area (small circle) 8 is determined from the comparison table shown in FIG. 17, and based on the determined radius r, area of the smaller circular area (small circle) 8 is determined.

Next, arrangement of the smaller circular areas (small circles) 8 in the mounting area (large circle) 5 is determined (S13). The arrangement of the smaller circular areas was determined by using a software that utilizes the theory of the close packing to determine arrangement of the smaller circular areas from the area of the mounting area and the number of smaller circular areas. The arrangement shown in FIG. 18 and FIG. 19 shows some of the variations for the number N of the light-emitting elements 1. It is possible to use the theory of close packing of circles to determine, for a number N that is arbitrary, the arrangement of smaller circular areas satisfying the arrangement condition. In the steps S12 and S13, relation between the area of the mounting area, number of the smaller circular areas and radius r of the smaller circular area has been obtained and tabulated in advance. However, the present invention is not limited to this embodiment, and radius r may be determined each time by using an algorithm.

Next, it is determined whether or not the arrangement of the smaller circular areas 8 determined in the step S13 overflows from the mounting area and/or whether or not the smaller circular areas overlap each other (S14). If the determination result is YES, the processing returns to step S13 and repeats arrangement of the smaller circular areas 8 until the determination result turns out to be NO.

Next, the arrangement of the smaller circular areas (small circles) 8 determined at step S13 is traced on the circular mounting area on the substrate to determine the mounting position of the light-emitting elements (S15).

Next, a mounting device is used to mount and adhere the light-emitting element to at the center position of the traced smaller circular areas (small circles) 8 (S16).

Next, order of connection of the light-emitting elements mounted in step S16 is determined and electrical connection is carried out (S17) as a process of a lighting device 10.

Feature of the above-described method for mounting light-emitting elements is that arrangement of N smaller circular areas (imaginary circles) each surrounding a light-emitting element is determined by using the theory of circle packing based on the area of the mounting area and the number N of the light-emitting elements to be mounted under a certain arrangement condition. This arrangement condition is that "N smaller circular areas each with radius of r set as large as possible are all arranged without an overlapping portion inside the circular mounting area of radius R". Under this condition, all of the smaller circular areas may be arranged in contact with each other, or one of a plurality of smaller circular areas may be arranged without coming into contact with any of the other small circular areas. The purpose of the mounting method for mounting light-emitting elements is to arrange as many light-emitting elements as possible in the mounting area while keeping the distance to the outer periphery of the mounting area and the distance among light-emitting elements as evenly as possible.

Figure 11:
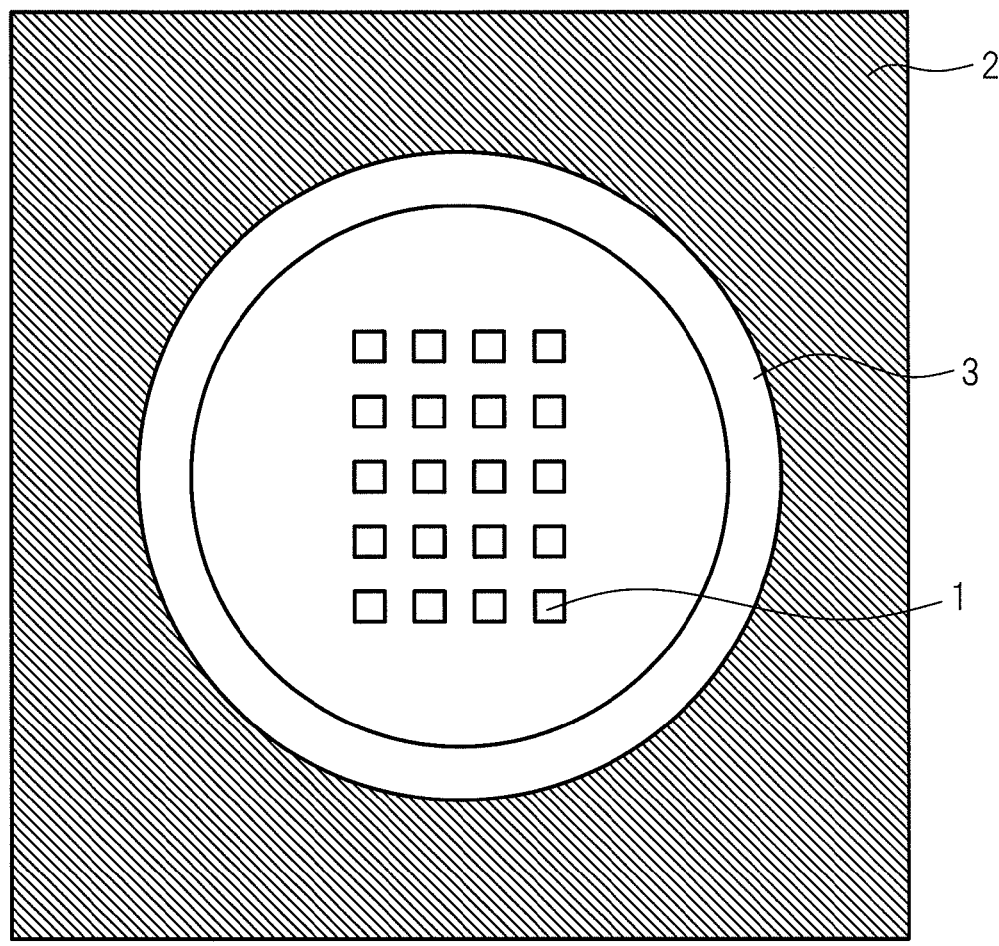
FIG. 11 is a schematic view showing arrangement of 20 same light-emitting elements 1 as shown in FIG. 5 arranged in a circular mounting area of the substrate of same size as in FIG. 5.
Figure 12:
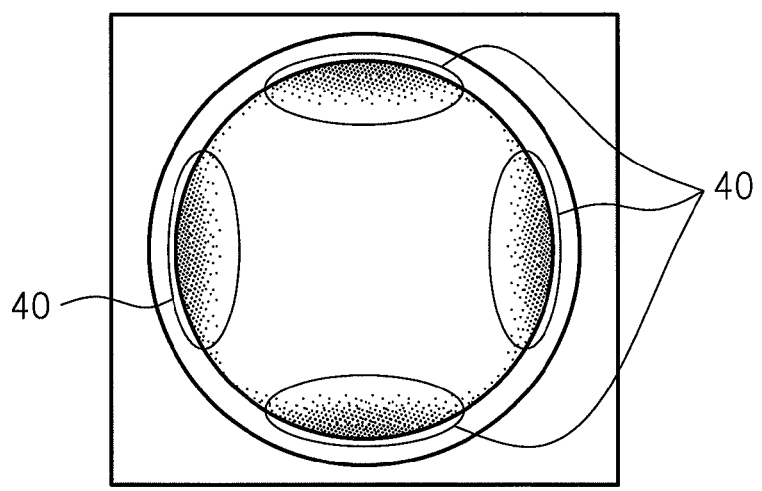
FIG. 12 is a schematic view showing light emission state when the light-emitting elements shown in FIG. 11 are lighted.

FIG. 11 is a view showing arrangement of the same 20 light-emitting elements 1 as shown in FIG. 5 inside an enclosure frame 3 of the same size as in FIG. 5, and FIG. 12 is a schematic view showing the light emission state when the light-emitting elements of the lighting device shown in FIG. 11 is lighted.

In FIG. 11, unlike in FIG. 5, 20 light-emitting elements 1 are arranged in concentration to the center portion. As a result, as shown in FIG. 12, dark portion may appear in some areas 40 close to the outside of light-emitting area that is sealed with resin in the enclosure frame 3 of the lighting device so that the entire inside of the enclosure frame 3 to form the light-emitting area of the lighting device does not emit light as a whole. In contrast, in the lighting device 10 shown in FIG. 1, the light-emitting elements 1 are arranged as evenly as possible inside the enclosure frame 3, and thus, the lighting device as a whole can emit light more uniformly from inside the enclosure frame 3.

With the above-described arrangement condition, under condition of determined area of the mounting area and determined number N of light-emitting elements, each light-emitting element has a space of radius r surrounding each light-emitting element, and a gap of 2r is given between adjacently disposed light-emitting elements. Therefore, all the light-emitting elements can have a same space of reflection area, and an equal buffer zone is provided between adjacently disposed light-emitting elements and to the sealing frame, and thus, all the light-emitting elements can have light emission characteristics, reflection characteristics and temperature characteristics under a same condition. Therefore, decrease of light emission due to varied characteristics of each light-emitting element that arises from the increase of the number of light-emitting elements arranged in the mounting area can be suppressed. As a result, the increase of the number of light-emitting elements in a mounting area and characteristics of each light-emitting element to be uniform can enhance the efficiency of light emission.

Figure 13:
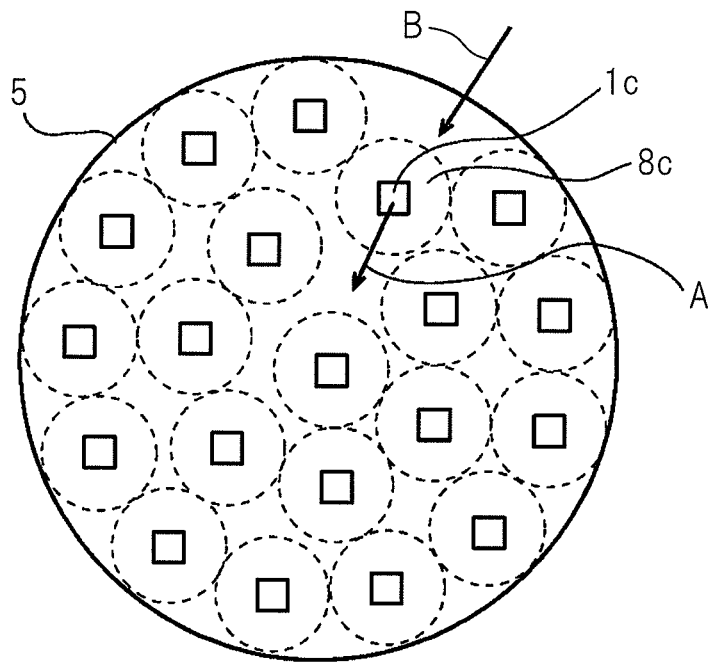
FIG. 13 is a view for reference showing the circular mounting areas for mounting light-emitting elements shown in FIG. 5.
Figure 14:
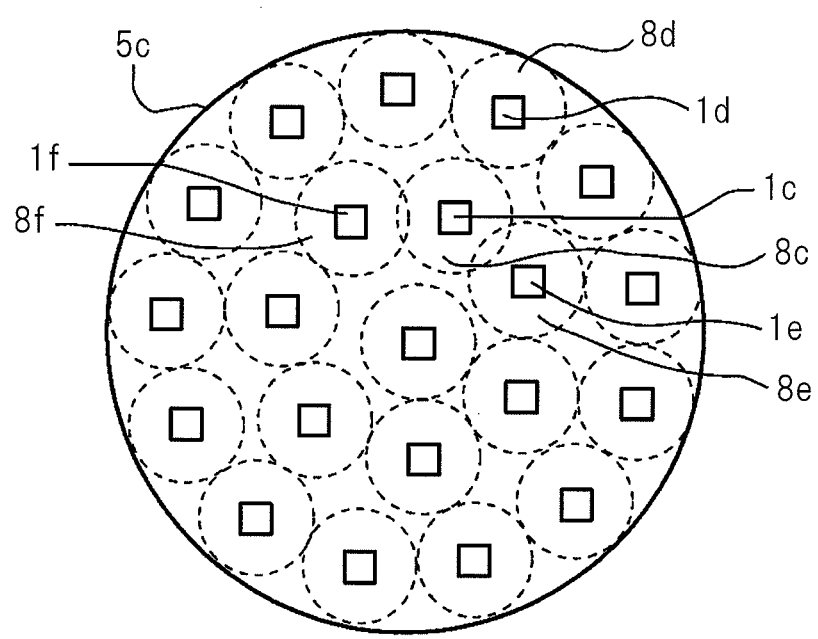
FIG. 14 is a view for reference showing an example of displacement and addition of smaller circular areas shown in FIG. 13.

FIG. 13 is a view for reference showing the mounting area shown in FIG. 5, and FIG. 14 is a view for reference showing an example of displacement and addition of smaller circular areas compared to as shown in FIG. 13. Features of the above-described method for mounting light-emitting elements will be described below with reference to FIG. 13 and FIG. 14.

20 smaller circular areas 8 shown in FIG. 13 represent an arrangement of 20 smaller circular areas 8 in the mounting area 5; 20 smaller circular areas each with radius of r set as large as possible are all contained inside the mounting area without an overlapping portion. However, it can be seen from FIG. 13 that there is a space around the smaller circular area 8c surrounding a light-emitting element 1c, and it seems that, by shifting the smaller circular area 8c in the direction of the arrow A, one more smaller circular area can be added in the space shown by the arrow B.

Accordingly, FIG. 14 is a view showing an arrangement in which the smaller circular areas are displaced and a smaller circular area is added. Thus, in the arrangement of FIG. 14, the smaller circular area 8c is moved in the direction of the arrow A, and a light-emitting element 1d that is positioned in a smaller circular area 8d is provided in the emptied space. The smaller circular area 8c that was moved has overlapping portions respectively overlapping smaller circular areas 8e and 8f. Thus, it can be seen that the condition of close packing of circles is not satisfied. As a result, the distance among the light-emitting element 1c and the light-emitting elements 1e, 1f is smaller than the distance between other pair of adjacently disposed light-emitting elements 1. Therefore, interference of light emission characteristics is produced with the light-emitting elements 1e, 1f, and due to proximity of light-emitting elements, effect of heat generation of light-emitting elements around the light-emitting element 1c may become remarkable. The light-emitting element 1c may be adversely affected by this concentration of heat generation. Intensity of light emission may be degraded, and in some cases, the emitting element 1c may be damaged.

In a lighting device including a plurality of light-emitting elements arranged in the mounting area, the plurality of light-emitting elements are connected and driven in parallel and in series, when only one light-emitting element is damaged, a group of light-emitting elements connected in series with the damaged light-emitting element become unable to emit light. The arrangement of light-emitting elements as shown in FIG. 14 may give rise to a problem in the characteristics and/or usable life of a lighting device. In contrast, in the lighting device having optimally arranged light-emitting elements as shown in FIG. 13, reliability of the light-emitting elements can be obtained, and a widest gap among the light-emitting elements can be obtained for the number of arranged light-emitting elements.

Figure 15:
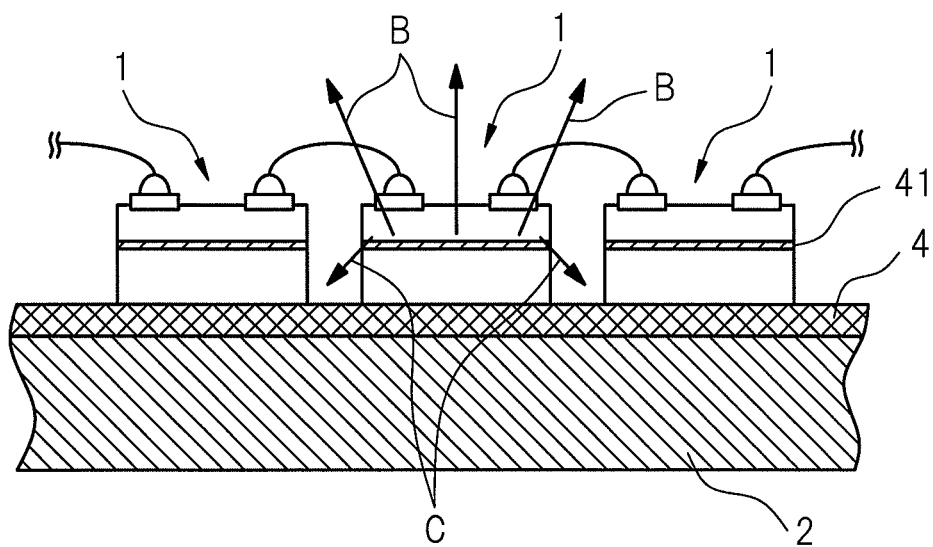
FIG. 15 is a schematic view showing light emission state when the light-emitting elements 1 are arranged in alignment with each other as shown in FIG. 11.
Figure 16:
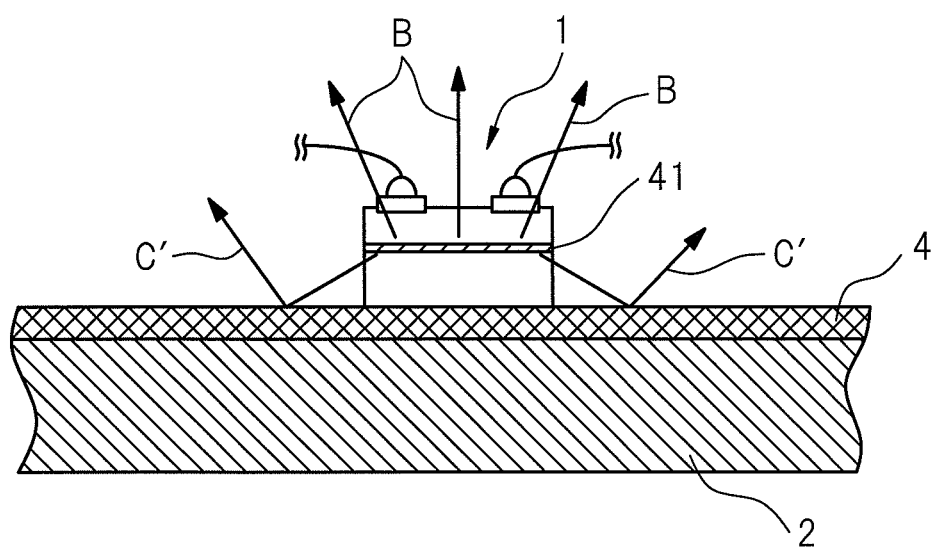
FIG. 16 is a schematic view showing light emission state when the light-emitting elements 1 are arranged in arrangement condition as shown in FIG. 5.

FIG. 15 is a schematic view showing the state of light emission when light-emitting elements are arranged in close proximity to each other as shown in FIG. 11. FIG. 16 is a schematic view showing the state of light emission when light-emitting elements are arranged in above-described arrangement condition as shown in FIG. 5.

The light-emitting element in the present embodiment is an LED bare chip including two electrodes on the upper surface and a light-emitting layer 41 on the upper surface side, and that is known as a face-up LED. Thus, light exiting from the light-emitting layer 41 exits from the upper surface side (the arrow B), but exits also from surrounding of the light-emitting element 1 (the arrow C). If, as shown in FIG. 15, the light-emitting elements 1 are arranged in alignment with each other, light exiting from surrounding of the light-emitting element 1 (the arrow C) may be obstructed other surrounding light-emitting elements as described above, or may produce interference with each other. In contrast, if light-emitting elements are arranged so as to produce as wide gap as possible around each light-emitting element under the given condition, light exiting from surrounding of the light-emitting element (the arrow C) is unlikely to produce interference with surrounding light-emitting elements 1.

Figure 7:
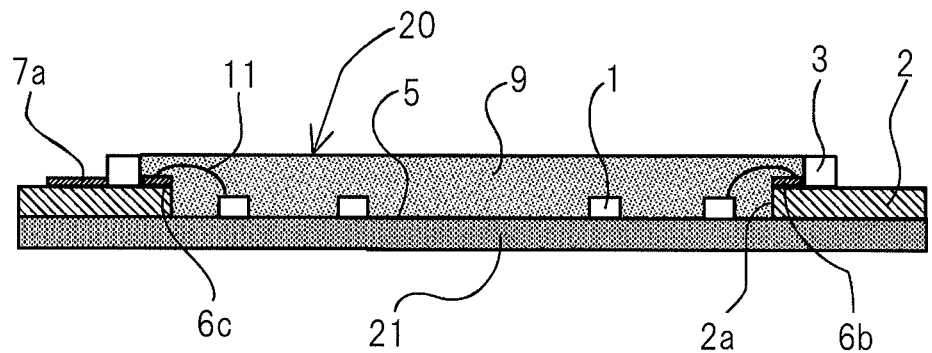
FIG. 7 is a sectional view showing a lighting device 20 according to a second embodiment.

FIG. 7 is a sectional view showing a lighting device 20 according to a second embodiment.

The plan view of the lighting device 20 is same as the plan view of the lighting device 10 shown in FIG. 1, and therefore, description thereof is omitted. Since the basic construction of the lighting device 20 is also the same as the lighting device 10, a same constituent is denoted by a same reference numeral, and a duplicate description is omitted.

The lighting device 20 according to the second embodiment differs from the lighting device 10 according to the first embodiment in that, whereas the lighting device 10 includes a substrate 2 made of resin and light-emitting elements 1 are mounted on the substrate 2, the lighting device 20 has a metal base 21 made of a metal plate and light-emitting elements are mounted on the metal base 21. In the lighting device 20, a substrate 2 made of a resin and having a circular opening 2a in the center is stacked on the metal base 21, and light-emitting elements 1 are directly mounted and adhered to the metal base 21 that is configured to be a circular mounting area 5 exposed from the opening 2a of the substrate 2. Connecting electrodes 6a~6f are formed around the opening 2a on the substrate 2, and enclosure frame 3 is formed around the connecting electrodes 6a~6f. Outside the enclosure frame 3, power supply electrodes 7a, 7b are formed. The light-emitting element 1 used is a light-emitting element having a pair of electrodes on the upper surface, and electrodes of adjacently disposed light-emitting elements are electrically connected to the connecting electrodes 6 with a wire 11. Inside of the enclosure frame 3 is sealed with a sealing resin 9.

In the lighting device 20, a metal base 21 on that the light-emitting elements 1 are adhesively mounted, and thus, heat radiating effect on the light-emitting elements 1 can be large and light emission of high output power is possible.

Figure 8:
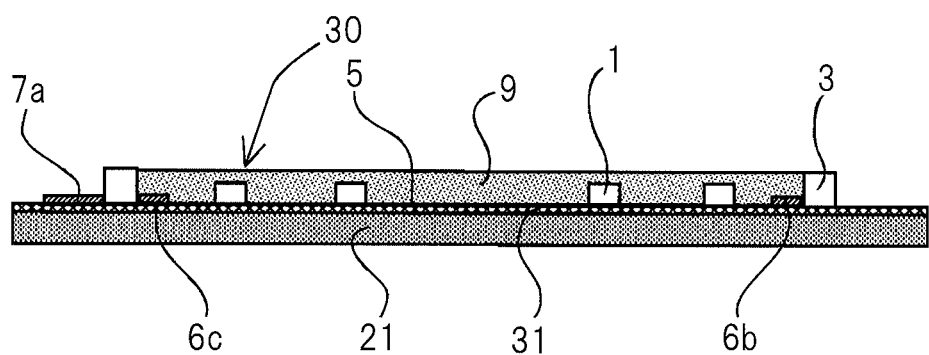
FIG. 8 is a sectional view showing a lighting device 30 according to a third embodiment.

FIG. 8 is a sectional view showing a lighting device 30 according to a third embodiment.

The plan view of the lighting device 30 is same as the plan view of the lighting device 10 shown in FIG. 1, and therefore, description thereof is omitted. Since the basic construction of the lighting device 30 is also same as the lighting device 10, a same constituent is denoted by a same reference numeral, and a duplicate description is omitted.

In the lighting device 20, the light-emitting elements 1 are directly mounted and adhered to the metal base 21, and the light-emitting element 1 including a pair of electrodes on the upper surface is used as a light-emitting element, and the electrode on the light-emitting element 1 and the connecting electrodes 6 are connected with a wire 11. In contrast, in the lighting device 30, an insulating reflection layer 31 may be formed on the entire upper surface of the metal base 21, and a wiring pattern (not shown) is formed on the insulating reflection layer 31. As light-emitting elements 1, light-emitting elements 1 including a pair of electrodes on the lower surface are used, and the light-emitting elements 1 are mounted in contact with the wiring pattern provided on the insulating reflection layer 31. Also, in the lighting device 30, on the insulating reflection layer 31, connecting electrodes 6a~6f are formed along a circular mounting area 5, and the light-emitting elements 1 and connecting electrodes 6a~6f are sealed with a circular sealing resin in top view formed inside the enclosure frame 3. Outside the enclosure frame 3, power supply connecting electrodes 7a, 7b may be formed. In the lighting device 30, connection among the light-emitting elements 1 and the connecting electrodes 6a~6f, and the power supply electrodes 7a, 7b can be achieved with an interconnection of the wiring pattern on the insulating reflection layer 31.

In the lighting device 30, the insulating reflection layer 31 may be formed on the metal base 21, and a wiring pattern is formed on the insulating reflection layer 31 to mount the light-emitting elements 1 having a pair of electrodes on the lower surface as a flip chip mounting. Therefore, in the lighting device 30, an effect heat radiation of the light-emitting element 1 can be high, and thus, light emission of high power output is possible. Further, in the lighting device 30, the light-emitting elements 1 with electrodes positioned at a lower surface is flipped and mounted on the wiring pattern provided on the insulating reflection layer 31. Also, as the electrodes positioned lower of the light-emitting elements 1 are mounted on the writing pattern as a flip chip mounting, the light device 30 can be thinned without a substrate 2.

In the above-described lighting devices 10~30, N smaller circular areas of radius r each with a light-emitting element at the center are provided in the circular mounting area under a certain arrangement condition based on the theory of circle packing. Here, the arrangement condition is that "N smaller circular areas each with radius of r set as large as possible are all arranged without an overlapping portion inside the circular mounting area of radius R". In this way, by increasing the number of light-emitting elements to be contained and arranged in a mounting area with characteristics of each light-emitting element to be at a constant level, efficient light emission can be increased.

A lens of circular shape in top view may be provided above the light emission area (that is inside the sealing frame) of the above-described lighting devices 10-30 . Also, a layer of phosphor may be provided between the lens and the light emission area.

The light-emitting element 1 used in the lighting device 10-30 may be an element of square or rectangular shape in outline in top view, that may be, a so-called LED bare chip (see FIG. 15 and FIG. 16). The LED bare chip may be a wafer level chip. Also, the light-emitting element 1 may be an LED chip in the shape of square or rectangle in top view including at least LED bare chip, and a substrate on that the LED bare chip is mounted. The shape of the light-emitting element 1 includes the case of a square or a rectangular parallelepiped in overall outline. The arranged light-emitting element 1 may include a layer of phosphor that is configured to convert wavelength of light in response to receipt of light emitted from an LED bare chip. The resin that seals the light-emitting element 1 as described above may contain a phosphor. Also, remote phosphor that is a layer of phosphor disposed above the light-emitting element 1 may be used.

In the lighting devices 10-30 described above, if the mounting area and the number of light-emitting elements to be mounted in the mounting area are determined, maximum diameter of the smaller circular area is uniquely determined from the area of the mounting area and the number of light-emitting elements to be mounted, and by mounting the light-emitting elements at the center of the smaller circular areas, the number of light-emitting elements to be contained in the mounting area can be maximized, and thus, a lighting device with high light emission efficiency can be provided.

In the lighting devices 10-30 described above, each light-emitting element is disposed at the center of selected smaller circular area, and thus, the same number of light-emitting elements can be arranged in a most discrete manner. Therefore, possibility of light exiting from each light-emitting element being obstructed by other light-emitting elements is minimized, and a lighting device having high light emission efficiency can be provided.

The terminology used herein is for the purpose of describing particular embodiments only and is not intended to limit of the invention. As used herein, the singular forms "a", "an" and "the" are intended to include the plural forms as well, unless the context clearly indicates otherwise. It will be further understood that the terms "comprises", "comprising", "includes", "including", "has" and/or "having" when used herein, specify the presence of stated features, integers, steps, operations, elements, and/or components, but do not preclude the presence or addition of one or more other features, integers, steps, operations, elements, and/or groups thereof.

What is claimed is:

1. A mounting method for mounting N light-emitting elements in a circular mounting area provided on a substrate of a lighting device, the method comprising:

setting the circular mounting area of radius R on the substrate which is surrounded by an enclosure frame;

setting N smaller circular areas each with radius of r, wherein radius r is the maximum radius that allows the N smaller circular areas to be maximized and to be all contained inside the circular mounting area of radius R without an overlapping portion of the N smaller circular areas on the basis of the theory of close packing of circles;

mounting the N light-emitting elements at the substrate to be positioned at the center positions of the N smaller circular areas; and electrically connecting the N light-emitting elements with electrodes, which are arranged around the mounting area on the substrate, by wire bonding; and filling a sealing resin, which includes phosphor materials, within the enclosure frame in order to seal the N light-emitting elements therein and create a light emitting area, wherein the N smaller circular areas are set with a packing ratio d of the N smaller circular areas in the mounting area to be 75% or higher, and N is an integer of 38 or more, and wherein smaller circular areas positioned at the outermost periphery of the N smaller circular areas inside the mounting area are set in contact with a circumferential edge defining the mounting area.

2. The mounting method for mounting light-emitting elements according to claim 1, wherein the mounting area of the substrate comprises an insulating white-colored reflection layer.

3. The mounting method for mounting light-emitting elements according to claim 1, wherein the mounting area is set to be an insulation treatment given to a metal base of aluminum.

4. The mounting method for mounting light-emitting elements according to claim 1, further comprising tracing the N smaller circular areas on the circular mounting area of radius R.

5. The mounting method for mounting light-emitting elements according to claim 1, wherein mounting the N light-emitting elements at the substrate to be positioned at the center positions of the N smaller circular areas comprises mounting and adhering the light-emitting elements.

\* \* \* \* \*